(12) United States Patent
Lopatin et al.

(10) Patent No.: US 7,169,706 B2
(45) Date of Patent: Jan. 30, 2007

(54) METHOD OF USING AN ADHESION PRECURSOR LAYER FOR CHEMICAL VAPOR DEPOSITION (CVD) COPPER DEPOSITION

(75) Inventors: Sergey D. Lopatin, Santa Clara, CA (US); Paul R. Besser, Sunnyvale, CA (US); Alline F. Myers, Santa Clara, CA (US); Jeremias D. Romero, Hayward, CA (US); Minh Q. Tran, Milpitas, CA (US); Lu You, San Jose, CA (US); Pin-Chin Connie Wang, Menlo Park, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 74 days.

(21) Appl. No.: 10/687,186

(22) Filed: Oct. 16, 2003

(65) Prior Publication Data

US 2005/0085073 A1    Apr. 21, 2005

(51) Int. Cl.
*H01L 21/44* (2006.01)
(52) U.S. Cl. .................. 438/687; 438/681; 438/685; 438/686; 438/637; 438/627
(58) Field of Classification Search ........ 438/685–688, 438/681, 643–644, 637, 648, 650, 653–654, 438/656, 626–628
See application file for complete search history.

(56) References Cited

U.S. PATENT DOCUMENTS 5,004,520 A    4/1991   Tsuji et al.
5,224,520 A    7/1993   Shinbara et al.
5,243,222 A    9/1993   Harper et al.
5,300,462 A    4/1994   Kakumu
5,552,341 A    9/1996   Lee
5,654,245 A    8/1997   Allen
5,770,517 A    6/1998   Gardner et al.
5,821,168 A   10/1998   Jain
5,882,738 A    3/1999   Blish, II et al.
5,899,740 A    5/1999   Kwon
5,969,422 A   10/1999   Ting et al.
6,015,749 A    1/2000   Liu et al.

(Continued)

FOREIGN PATENT DOCUMENTS

EP    0 567 867 A2    11/1993

(Continued)

OTHER PUBLICATIONS 4.7.3 General Reliability Issues Associated with IC Interconnects; Silicon Processing for the VLSI Era; vol. II, pp. 264-265.

(Continued)

*Primary Examiner*—Thanh Nguyen
(74) *Attorney, Agent, or Firm*—Foley & Lardner LLP

(57) ABSTRACT

An exemplary embodiment is related to a method of using an adhesion precursor in an integrated circuit fabrication process. The method includes providing a gas of material over a dielectric material and providing a copper layer over an adhesion precursor layer. The adhesion precursor layer is formed by the gas, and the dielectric material includes an aperture.

20 Claims, 3 Drawing Sheets

U.S. PATENT DOCUMENTS

| | | | |
|---|---|---|---|
| 6,030,895 A | 2/2000 | Joshi et al. | |
| 6,037,001 A | 3/2000 | Kaloyeros et al. | |
| 6,069,068 A | 5/2000 | Rathore et al. | |
| 6,090,701 A * | 7/2000 | Hasunuma et al. | 438/632 |
| 6,090,710 A | 7/2000 | Andricacos et al. | |
| 6,096,648 A | 8/2000 | Lopatin et al. | |
| 6,117,770 A | 9/2000 | Pramanick et al. | |
| 6,130,156 A | 10/2000 | Havemann et al. | |
| 6,156,638 A | 12/2000 | Agarwal et al. | |
| 6,180,522 B1 | 1/2001 | Hong | |
| 6,181,012 B1 * | 1/2001 | Edelstein et al. | 257/762 |
| 6,225,221 B1 | 5/2001 | Ho et al. | |
| 6,242,808 B1 | 6/2001 | Shimizu et al. | |
| 6,268,291 B1 | 7/2001 | Andricacos et al. | |
| 6,294,463 B1 | 9/2001 | Tseng | |
| 6,294,836 B1 | 9/2001 | Paranjpe et al. | |
| 6,297,146 B1 | 10/2001 | Lopatin | |
| 6,307,265 B1 * | 10/2001 | Anand et al. | 257/758 |
| 6,344,413 B1 | 2/2002 | Zurcher et al. | |
| 6,365,502 B1 | 4/2002 | Paranjpe et al. | |
| 6,399,496 B1 | 6/2002 | Edelstein et al. | |
| 6,410,383 B1 | 6/2002 | Ma | |
| 6,420,262 B1 | 7/2002 | Farrar | |
| 6,423,289 B1 | 7/2002 | Klatte | |
| 6,423,633 B1 | 7/2002 | Tseng | |
| 6,426,289 B1 | 7/2002 | Farrar | |
| 6,429,493 B1 * | 8/2002 | Asahina et al. | 257/382 |
| 6,440,849 B1 | 8/2002 | Merchant et al. | |
| 6,461,675 B2 * | 10/2002 | Paranjpe et al. | 427/250 |
| 6,461,909 B1 * | 10/2002 | Marsh et al. | 438/238 |
| 6,465,867 B1 | 10/2002 | Bernard et al. | |
| 6,482,734 B1 | 11/2002 | Ha et al. | |
| 6,482,740 B2 | 11/2002 | Soininen et al. | |
| 6,500,749 B1 | 12/2002 | Liu et al. | |
| 6,521,532 B1 | 2/2003 | Cunningham | |
| 6,534,865 B1 | 3/2003 | Lopatin et al. | |
| 6,589,874 B2 | 7/2003 | Andricacos et al. | |
| 6,605,874 B2 | 8/2003 | Leu et al. | |
| 6,703,307 B2 | 3/2004 | Lopatin et al. | |
| 6,706,626 B2 * | 3/2004 | Huang | 438/653 |
| 6,713,373 B1 * | 3/2004 | Omstead | 438/608 |
| 6,790,773 B1 * | 9/2004 | Drewery et al. | 438/643 |
| 2001/0035237 A1 | 11/2001 | Nagano et al. | |
| 2002/0036309 A1 | 3/2002 | Sekiguchi et al. | |
| 2002/0039542 A1 | 4/2002 | Bogel et al. | |
| 2002/0053741 A1 | 5/2002 | Iwasaki et al. | |
| 2002/0076925 A1 | 6/2002 | Marieb et al. | |
| 2002/0084529 A1 | 7/2002 | Dubin et al. | |
| 2002/0102838 A1 | 8/2002 | Paranjpe et al. | |
| 2002/0109233 A1 | 8/2002 | Farrar | |
| 2002/0137332 A1 | 9/2002 | Paranjpe et al. | |
| 2004/0105934 A1 * | 6/2004 | Chang et al. | 427/255.28 |
| 2004/0192021 A1 * | 9/2004 | Li | 438/622 |
| 2005/0124154 A1 * | 6/2005 | Park et al. | 438/643 |

FOREIGN PATENT DOCUMENTS

| | | |
|---|---|---|
| EP | 1 039 531 A2 | 9/2000 |
| EP | 1 039 531 A3 | 12/2000 |
| EP | 1 094 515 A2 | 4/2001 |

OTHER PUBLICATIONS

James A. Cunningham, "Improving Copper Interconnects: A Search for Useful Dopants," Semiconductor International, (Apr. 2000), pp. 1-8.

Dong Joon Kim et al, "New Method to Prepare W—B$^+$—N Ternary Barrier to Cu diffusion by Implanting BF$_2^+$ Ions Into W—N Thin Film," J. Vac. Sci. Technol. B 17(4), Jul./Aug. 1999, pp. 1598-1601.

W. F. McArthur et al., "Structural and Electrical Characterization of Si-Implanted Tin as a Diffusion Barrier for Cu Metallization," Mat. Res. Soc. Symp. Proc. vol. 391, 1995, pp. 327-332.

PCT International Search Report, International Application No. PCT/US 02/32605, International Filing Date Nov. 10, 2002 (7 pages).

PCT International search Report, International Application No. PCT/US 02/32554, International Filing Date Nov. 10, 2002 (5 pages).

* cited by examiner

METHOD OF USING AN ADHESION PRECURSOR LAYER FOR CHEMICAL VAPOR DEPOSITION (CVD) COPPER DEPOSITION

CROSS REFERENCE TO RELATED APPLICATIONS

This application is related to U.S. patent application Ser. No. 10/145,944, entitled METHOD OF FORMING AN ADHESION LAYER WITH AN ELEMENT REACTIVE WITH A BARRIER LAYER, assigned to the same assignee as this application.

FIELD OF THE INVENTION

The present invention relates generally to integrated circuits and methods of manufacturing integrated circuits. More particularly, the present invention relates to using an adhesion precursor layer for chemical vapor deposition (CVD) copper deposition.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

Conventional integrated circuits utilize vias to connect structures (e.g., gates, drain regions, source regions) and conductive lines. For example, a via can connect a gate above the substrate to a conductor line in a metal 1 layer. Vias can also interconnect conductive lines. For example, a via can connect a conductive line in a metal 1 layer to a conductor line in a metal 2 layer. A via is typically a metal plug which extends through an insulative layer in a multi-layer integrated circuit. Vias and barrier layers are discussed in U.S. Pat. Nos. 5,646,448; 5,770,519; and 5,639,691; each of which are assigned to the assignee of the present application.

A barrier layer is used to protect the via and insulative layer from metal diffusion and the via and conductive line from electromigration (EM). The barrier layer can contribute significantly to resistance associated with the via metal. Electromigration is the mass transport due to momentum exchange between conducting electrons and diffusing metal atoms. Electromigration causes progressive damage to the metal conductors in an integrated circuit. In general, metals are most susceptible to electromigration at very high current density and temperatures of 100° C. or more.

According to a conventional plasma vapor deposition (PVD) process, IC manufacturers deposit a very thin barrier layer of Tungsten (W). The barrier layer can be deposited in a $SiH_4$, $WFl_6 \rightarrow WSi_2$ process. The barrier layer servers to adhere to the underlying dielectric layer and serve as a nucleation layer to further Tungsten deposition. Additional layers of Tungsten can be deposited in a $WFl_6+H_2$ deposition process without the use of $SiH_4$.

Other conventional conductive lines have utilized pure copper or copper alloy lines formed in a damascene process. According to a conventional damascene process, copper lines are filled by electroplating a trench in a dielectric layer. The dielectric layer is typically covered by a barrier and/or a seed layer before electroplating to fill the trench with copper. After the trench is filled with copper, a barrier layer is provided above a copper conductive line and a subsequent interlevel dielectric layer is provided. The barrier layer is necessary to prevent electromigration and to protect the dielectric layer from copper diffusion. Further, the barrier layer reduces problems associated with having the dielectric material adhere to dielectric material.

Forming continuous barrier layers in ultra-narrow vias and metal lines can be difficult. Vias and trenches for the metal lines can be less than 160 nm in width, making formation of continuous and conformal barrier and/or seed layers challenging. As IC fabrication techniques improve, the via and trench widths become ever smaller. Therefore, metallization of in-laid trenches and vias is becoming a more difficult task.

Thus, there is a need for method of using an adhesion precursor for chemical vapor deposition (CVD) copper deposition. Further, there is a need for a method of causing copper to better adhere to dielectric material to form a continuous barrier layer in vias and metal lines. Even further, there is a need for an improved electromigration barrier.

SUMMARY OF THE INVENTION

An exemplary embodiment is related to a method of using an adhesion precursor in an integrated circuit fabrication process. The method includes providing a gas of material over a dielectric material and providing a copper layer over an adhesion precursor layer. The adhesion precursor layer is formed by the gas, and the dielectric material includes an aperture.

Another exemplary embodiment is related to a method of improving adhesion between a copper layer and a dielectric layer by providing an adhesion precursor. The method includes forming a trench in a dielectric layer, providing an adhesion precursor gas above the dielectric layer and the trench to form an adhesion precursor layer, providing an alloy layer above the adhesion precursor layer, and providing a copper layer above the alloy layer.

Another exemplary embodiment is related to a method of using an adhesion precursor for chemical vapor deposition. The method includes forming a trench in a dielectric layer, forming a continuous barrier layer above the dielectric layer and along sides of the trench, depositing copper above the continuous barrier layer where the copper located in the trench forms an integrated circuit feature.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
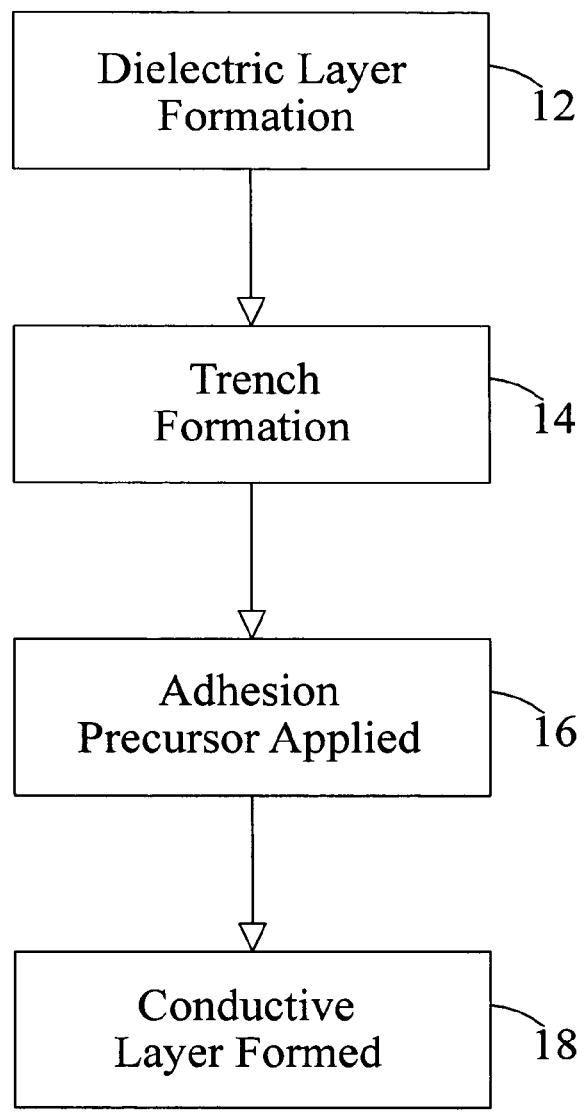
FIG. 1 is a flow diagram depicting exemplary operations in a process for using an adhesion precursor in an integrated circuit fabrication process in accordance with an exemplary embodiment.

With reference to FIG. 1, an advantageous process 10 for forming a conductive line that allows copper deposited with suitable adhesion is disclosed. Process 10 utilizes a layered conductive line structure.

Process 10 includes a dielectric layer formation operation 12, a trench formation operation 14, a adhesion precursor operation 16 and a conductive layer formation step 18. In dielectric layer formation operation 12, a dielectric material is provided above a substrate or other underlying layer. The dielectric material can be deposited using a variety of techniques, including chemical vapor deposition. In trench formation operation 14, a trench or an aperture is formed in the dielectric material layer formed in dielectric layer formation operation 12. A trench can be formed using an etching technique, such as reactive ion etching (RIE) or plasma etching.

In adhesion precursor operation 15, an adhesion precursor layer is provided above the dielectric layer, including side walls of the dielectric layer defined by the trench formed in the dielectric layer. The adhesion precursor can be provided as a gas in some type of vapor deposition process. The adhesion precursor gas forms a layer that helps improve adhesion between the dielectric material and the conductive line.

In conductive layer formation operation 18, a conductive layer is provided above the adhesion precursor layer. A variety of different deposition techniques may be used to provide the conductive material that makes up the conductive layer. For example, a plasma enhanced chemical vapor deposition (PECVD) can be used. Conductive material formed in the trench can be used as an interconnect or via.

Figure 2:
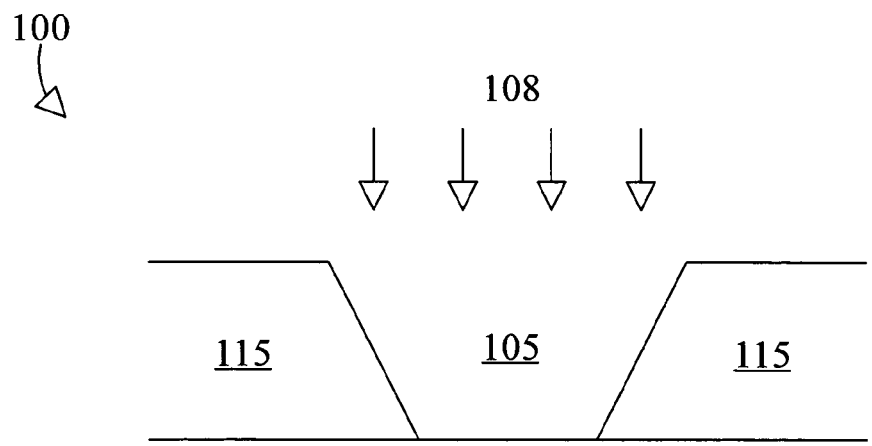
FIG. 2 is a schematic cross-sectional view representation of a portion of an integrated circuit, showing a barrier adhesion layer formation in accordance with an exemplary embodiment.

With reference to FIG. 2, a schematic cross-sectional view representation of a portion 100 of an integrated circuit includes an aperture 105 and a dielectric layer 115. Portion 100 is preferably part of an ultra-large-scale integrated (ULSI) circuit having millions or more transistors. Portion 100 is manufactured as part of the integrated circuit on a semiconductor wafer, such as, a silicon wafer.

Aperture 105 is formed in preparation for the creation of a via or trench by etching a portion of dielectric layer 115. In an exemplary embodiment, dielectric layer 115 is an oxide material or other suitable material. Layer 115 can be provided above another dielectric layer or a substrate.

A gas 108 including an initial depositing metal is provided to portion 100. Gas 108 is selected to include materials that form a thin barrier adhesion layer conformal to side walls of aperture 105 and a top 111 of dielectric layer 115. Gas 108 can include tantalum nitride (TaN), tungsten nitride(WN), disilicon nitride ($Si_2N$), or any of a variety of other barrier materials. Preferably, gas 108 deposits a layer with a cross-sectional thickness of up to 500 Angstroms.

Figure 3:
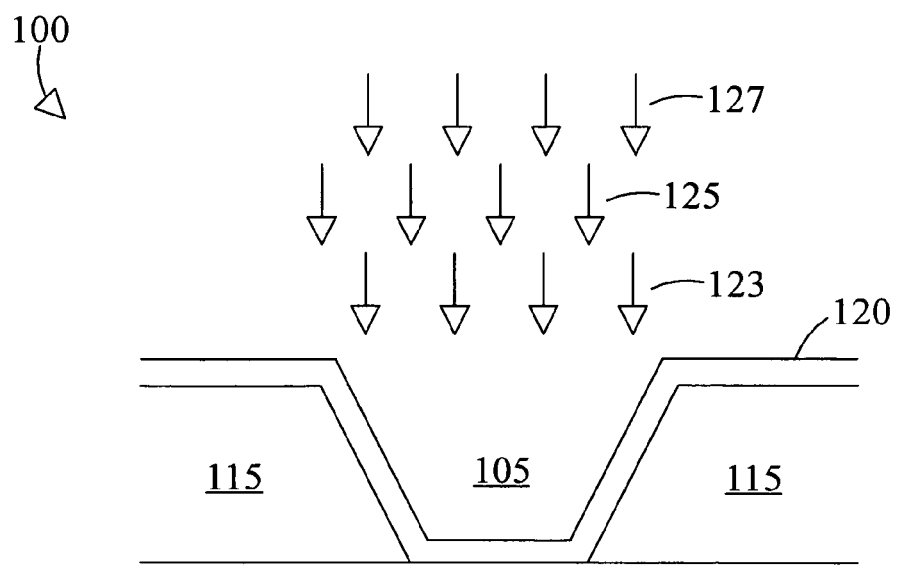
FIG. 3 is a schematic cross-sectional view representation of a portion of an integrated circuit, showing gas deposition in accordance with another exemplary embodiment.

FIG. 3 illustrates portion 100 after formation of a barrier adhesion layer 120. Barrier adhesion layer 120 can have a thickness of 10 to 100 Angstroms. Advantageously, barrier adhesion layer 120 is a thin, continuous, and controllable layer that is adhesive to copper. Barrier adhesion layer 120 can help prevent electromigration effects. Further, barrier adhesion layer 120 adheres to dielectric layer 115.

In at least one exemplary embodiment, barrier adhesion layer 120 can include a ternary element, such as, Iridium (Ir), Ruthenium (Ru), Rhenium (Re), or other suitable material. The alloy element for barrier adhesion layer 120 can be applied at a dose of $2e^{14}$ atoms/$cm^2$ or $2e^{15}$ atoms/$cm^2$ and applied at an energy of, for example, 0.5 to 5 keV.

In at least one embodiment, a gas 123 can be provided to deposit an initial material over barrier adhesion layer 120. Gas 123 can include a material, such as, zirconium (Zr), calcium (Ca), or aluminum (Al). Preferably, gas 123 has a concentration of 30% of the material. A gas 125 can also be provided over barrier adhesion layer 120. Gas 125 can include copper (Cu) at a concentration of 10%.

In at least one alternative embodiment, a gas 127 can be provided in addition to gases 123 and 125. Gas 127 can include an alloying element. The alloying element of gas 127 can include tin(Sn), indium (In), zinc (Zn), or chromium (Cr). The alloying element can be chosen to improve electromigration effects.

Figure 4:
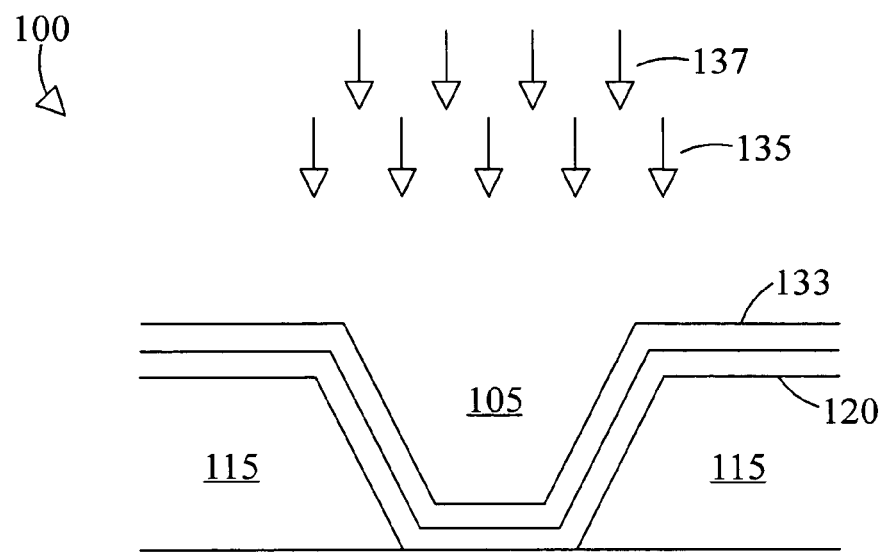
FIG. 4 is a schematic cross-sectional view representation of a portion of an integrated circuit, showing a bulk deposition in accordance with an exemplary embodiment.

FIG. 4 illustrates portion 100 after the gases 123 and 125 are provided. In at least one embodiment, gas 127 is also provided. The deposited gases can form a blending layer 133 conformal to barrier adhesion layer 120. Blending layer 133 can be up to 250 Angstroms in thickness.

A gas 135 can be provided over blending layer 133 and barrier adhesion layer 120. Gas 135 can include materials for a bulk deposition of, for example, copper (Cu). In an exemplary embodiment, gas 135 has a concentration of 30% of Cu. In at least one alternative embodiment, a gas 137 including an alloying element is also provided. Alloying elements in gas 137 can be zirconium (Zr), calcium (Ca), aluminum (Al), lanthanum (La), or hafnium (Hf).

Figure 5:
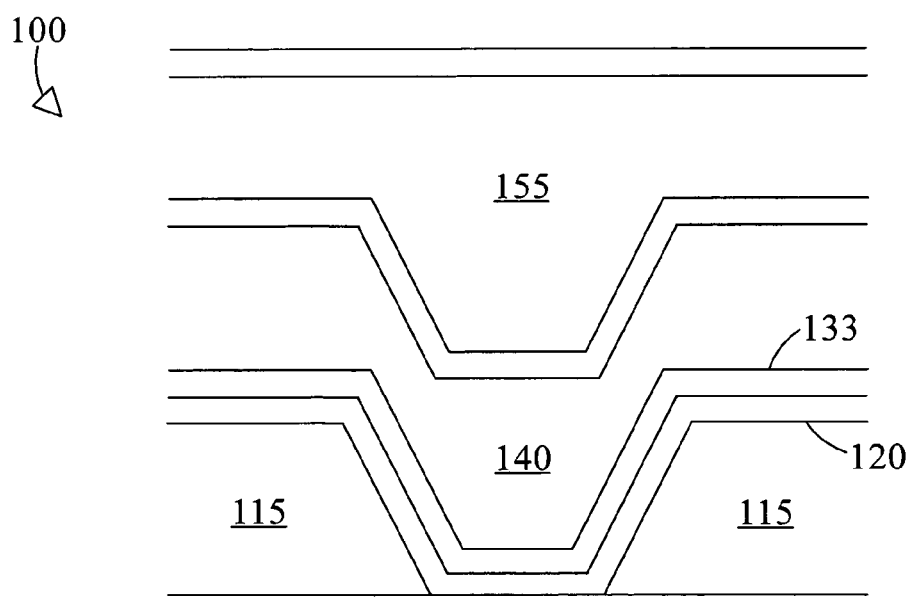
FIG. 5 is a schematic cross-sectional view representation of a portion of an integrated circuit, showing a copper via over a barrier adhesion layer in accordance with another exemplary embodiment.

FIG. 5 illustrates portion 100 after formation of a copper layer 140, an alloy layer 150, a copper layer 155, and a barrier 160. Copper layer 140 and copper layer 155 can be formed by materials contained in gas 135 described with reference to FIG. 3. Alloy layer 150 can be formed by materials contained in gas 137 described with reference to FIG. 4.

Copper layer 140 can have a thickness of up to 5,000 Angstroms. Alloy layer 150 can have a thickness of up to 50 Angstroms. Barrier 160 can be formed at the top of copper layer 155. Barrier 160 can be located where a chemical mechanical polish (CMP) is expected to stop. As such, barrier 160 can provide an anti-dishing layer.

Alloy layer 150 can be provided between copper layer 140 and copper layer 155 at a location just below an exposed post-CMP surface to help preserve an upper interface from copper electromigration. Therefore, portion 100 can be planarized until layer 150 is reached. In FIG. 5, layer 150 is not located above layer 155.

Advantageously, use of an adhesion precursor layer, such as, barrier adhesion layer 120, allows the formation of a continuous barrier layer in ultra-narrow vias and metal lines. Use of chemical vapor deposition (CVD) in creation of various layers described with reference to the FIGURES can provide better step coverage as well as controlled atomic layer thickness of deposited layers.

While the exemplary embodiments illustrated in the figures and described above are presently preferred, it should be understood that these embodiments are offered by way of example only. Other embodiments may include, for example, different gases, concentrations of materials, and alloying elements. The invention is not limited to a particular embodiment, but extends to various modifications, combinations, and permutations that nevertheless fall within the scope and spirit of the appended claims.

The invention claimed is:

1. A method of using an adhesion precursor layer in an integrated circuit fabrication process, the method comprising:
    providing an adhesion layer over a dielectric material, the dielectric material including an aperture, the adhesion layer including a ternary element of Iridium, Ruthenium, or Rhenium;
    providing a blending layer comprised of an initial metal material, a copper containing material, and an alloying element of Sn, In, Zn, or Cr; and
    providing a copper layer over the blending layer, the copper layer including Zr, Ca, Al, La, or Hf.

2. The method of claim 1, wherein the adhesion layer includes a barrier material.

3. The method of claim 1, wherein the adhesion precursor layer has a thickness of 10–100 Angstroms.

4. The method of claim 1, further comprising providing a three gasses to form the blending layer over the adhesion layer.

5. A method of using an edhesion precursor in an integrated circuit fabrication process, the method comprising:
    providing an adhesion layer over a dielectric material, the dielectric material including an aperture;
    providing a blending layer comprised of an initial metal material, a copper containing material, and an alloying element of Sn, In, Zn, or Cr; and
    providing a copper layer over the blending layer, wherein the copper layer is provided using a second gas including tin (Sn), indium (In), zinc (Zn), or chromium (Cr.), wherein the adhesion layer is provided using a first gas including a ternary element of at least one of Iridium, Ruthenium, or Rhenium.

6. The method of claim 4, wherein a third gas is utilized for the blending layer.

7. A method of using an adhesion precursor in an integrated circuit fabrication process, the method comprising:
    providing a gas of a first material over a dielectric material to form an adhesion layer, the dielectric material including an aperture, the first material including a ternary element of Iridium, Ruthenium, or Rhenium;
    providing a blending layer comprised of an initial metal material, a copper containing material, and an alloying element of Sn, In, Zn, or Cr; and
    providing a copper layer over the blending using gas including an alloying element.

8. A method of using an adhesion precursor in an integrated circuit fabrication process, the method comprising:
    providing a gas of a first material over a dielectric material to form an adhesion layer, the dielectric material including an aperture;
    providing a blending layer comprised of an initial metal material, a copper containing material, and an alloying element of Sn, In, Zn, or Cr; and
    providing a copper layer over the blending layer, wherein the adhesion layer includes a ternary element of Iridium, Ruthenium, or Rhenium.

9. The method of claim 8, further comprising providing a gas including an alloying agent over the adhesion layer when providing the blending layer.

10. A method of improving adhesion between a copper layer and a dielectric layer by providing an adhesion precursor, the method comprising:
    forming a trench in a dielectric layer;
    providing an adhesion precursor gas above the dielectric layer and the trench to form an adhesion precursor layer, wherein the adhesion precursor layer includes a ternary element of Iridium, Ruthenium, or Rhenium and a blending layer comprised of an initial metal material, a copper containing material and an alloying element of Sn, In, Zn, or Cr;
    providing a copper layer above the blending layer.

11. The method of claim 10, wherein the adhesion precursor layer has a thickness of 10–100 Angstroms.

12. The method of claim 10, wherein the blending layer includes an alloying material.

13. The method of claim 10, wherein the adhesion precursor layer includes a material being selected from a group consisting of tantalum nitride, tungsten nitride, or disilicon nitride.

14. The method of claim 10, wherein the blending layer has a thickness of up to 250 Angstroms.

15. A method of using an adhesion precursor for chemical vapor deposition, the method comprising:
    forming a trench in a dielectric layer;
    forming a continuous barrier adhesion precursor layer above the dielectric layer and along sides of the trench the continuous barrier adhesion precursor layer including an adhesion layer and a blending layer, the blending layer includes an initial metal material, a copper containing material, and an alloying element of Sn, In, Zn, or Cr;
    depositing copper above the continuous barrier layer, the copper located in the trench forming an integrated circuit feature, wherein the adhesion layer includes a ternary material selected from a group consisting of Iridium (Ir), Ruthenium (Ru) and Rhenium (Re).

16. The method of claim 15, wherein the continuous barrier adhesion precursor layer includes Rhenium.

17. The method of claim 15, further comprising providing a chemical mechanical polish to level the copper to substantially the same level as the continuous barrier layer above the dielectric layer.

18. The method of claim 15, wherein the continuous barrier layer has a cross-sectional thickness of 10–100 Angstroms.

19. The method of claim 15, wherein the feature is a via.

20. The method of claim 15, wherein the continuous barrier adhesion precursor layer includes tantalum nitride, tungsten nitride, or disilicon nitride.

* * * * *

UNITED STATES PATENT AND TRADEMARK OFFICE
CERTIFICATE OF CORRECTION

PATENT NO. : 7,169,706 B2  Page 1 of 1
APPLICATION NO. : 10/687186
DATED : January 30, 2007
INVENTOR(S) : Sergey D. Lopatin et al.

It is certified that error appears in the above-identified patent and that said Letters Patent is hereby corrected as shown below:

Column 5:
line 27, delete "a" after "providing".
line 30, replace "edhesion" with --adhesion--.
line 54, insert --layer-- between "blending" and "using".

Column 6:
line 18, insert --,-- between "material" and "and".
line 19, insert --and-- after "Cr;".

Signed and Sealed this

Tenth Day of April, 2007

JON W. DUDAS
*Director of the United States Patent and Trademark Office*